United States Patent [19]

Janisiewicz et al.

[11] 4,283,836
[45] Aug. 18, 1981

[54] MULTI-MODULE DIP TRANSFER AND INSERTION MACHINE

[75] Inventors: Stanley Janisiewicz, Endwell; Robert H. Holmes, Binghamton, both of N.Y.

[73] Assignee: Universal Instruments Corporation, Binghamton, N.Y.

[21] Appl. No.: 78,682

[22] Filed: Sep. 25, 1979

[51] Int. Cl.³ .............................................. H05K 3/30
[52] U.S. Cl. ...................................... 29/564.1; 29/741; 29/835; 29/836
[58] Field of Search ....................... 29/741, 739, 564.1, 29/834, 835, 836

[56] References Cited

U.S. PATENT DOCUMENTS

| 3,727,284 | 4/1973 | Ragard et al. | 29/564.1 |
| 4,030,180 | 6/1977 | Pierson | 29/741 |

Primary Examiner—Carl E. Hall
Attorney, Agent, or Firm—Fidelman, Wolffe & Waldron

[57] ABSTRACT

An apparatus is provided for individually selecting a number of dual in-line (DIP) components and sequentially inserting them into a printed circuit board. The apparatus has a basic mode of operation, under a program control, and comprises a shuttle assembly and a component insertion assembly. In operation, the shuttle assembly transfers a component from a selected one of a plurality of magazines to an unload station. At the unload station, the shuttle assembly loads the insertion assembly which rotates to a vertical position for insertion of the component in a printed circuit board. The printed circuit board is mounted on an X-Y positioning system controlled by a tape reader or a computer which also determines the automatic sequencing of the shuttle assembly.

27 Claims, 31 Drawing Figures

PRIOR ART HEAD LOCATION

FRONT INSERT FINGERS, 2 LEADS; WITH REAR, 4 LEADS

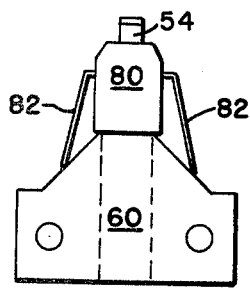
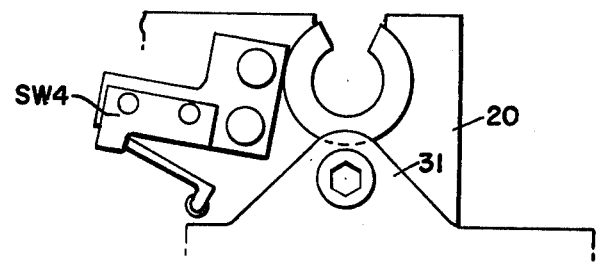
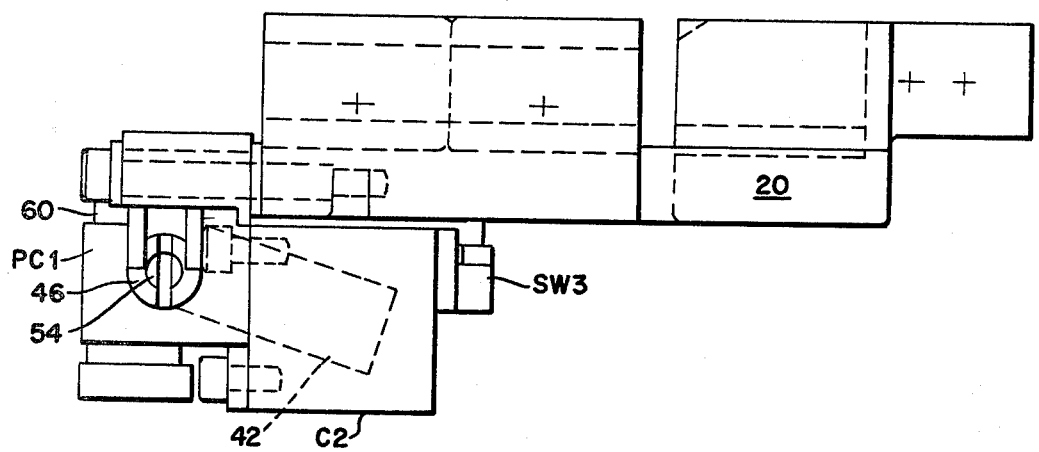
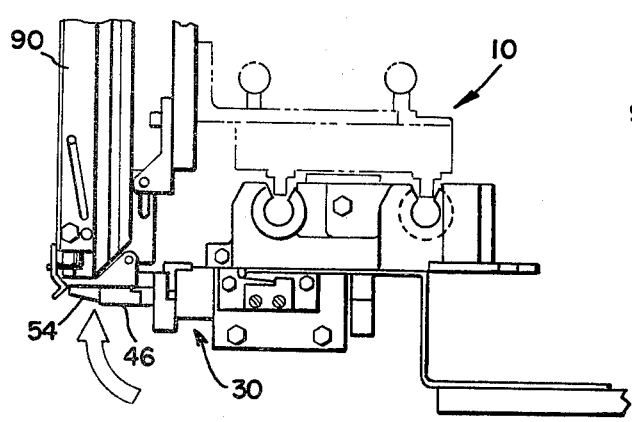
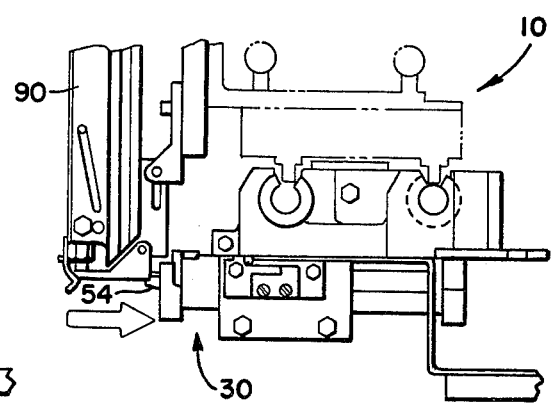

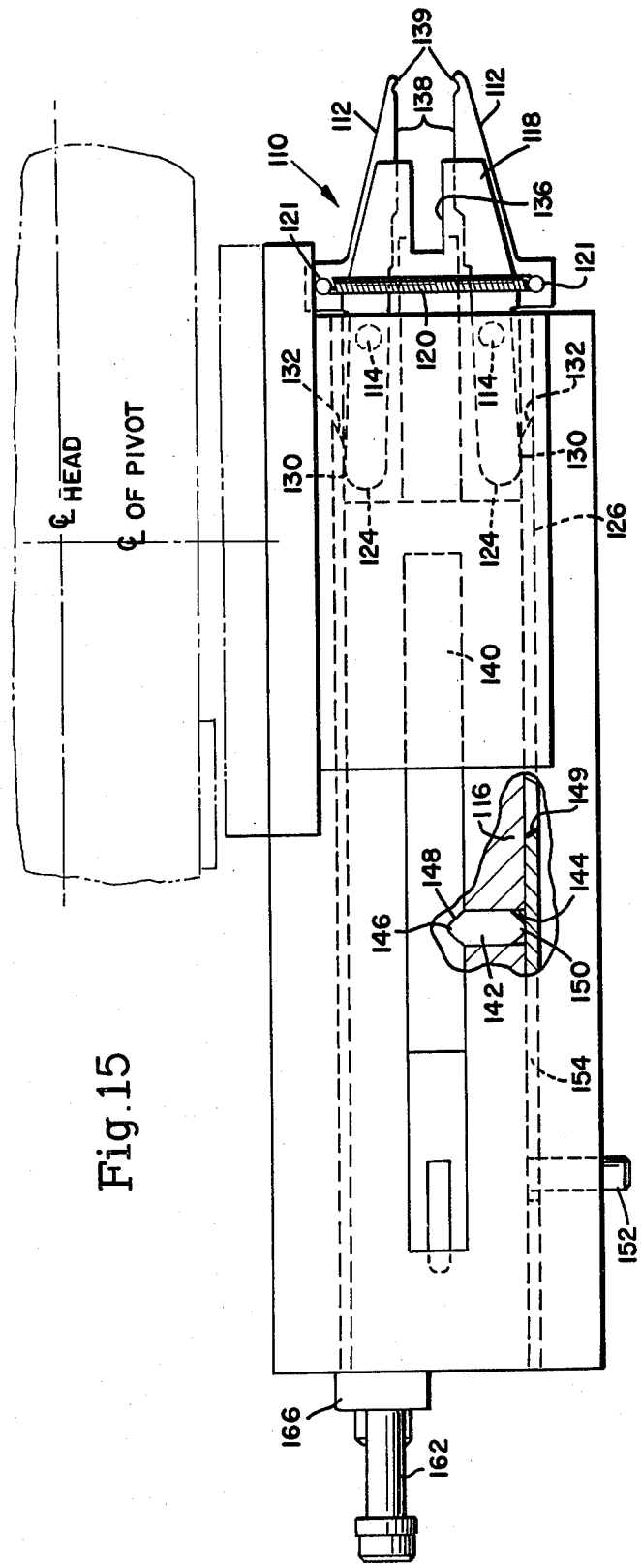
Fig. 15
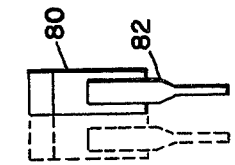
Fig. 17C
Fig. 17B
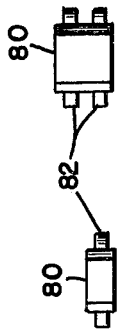
Fig. 17A

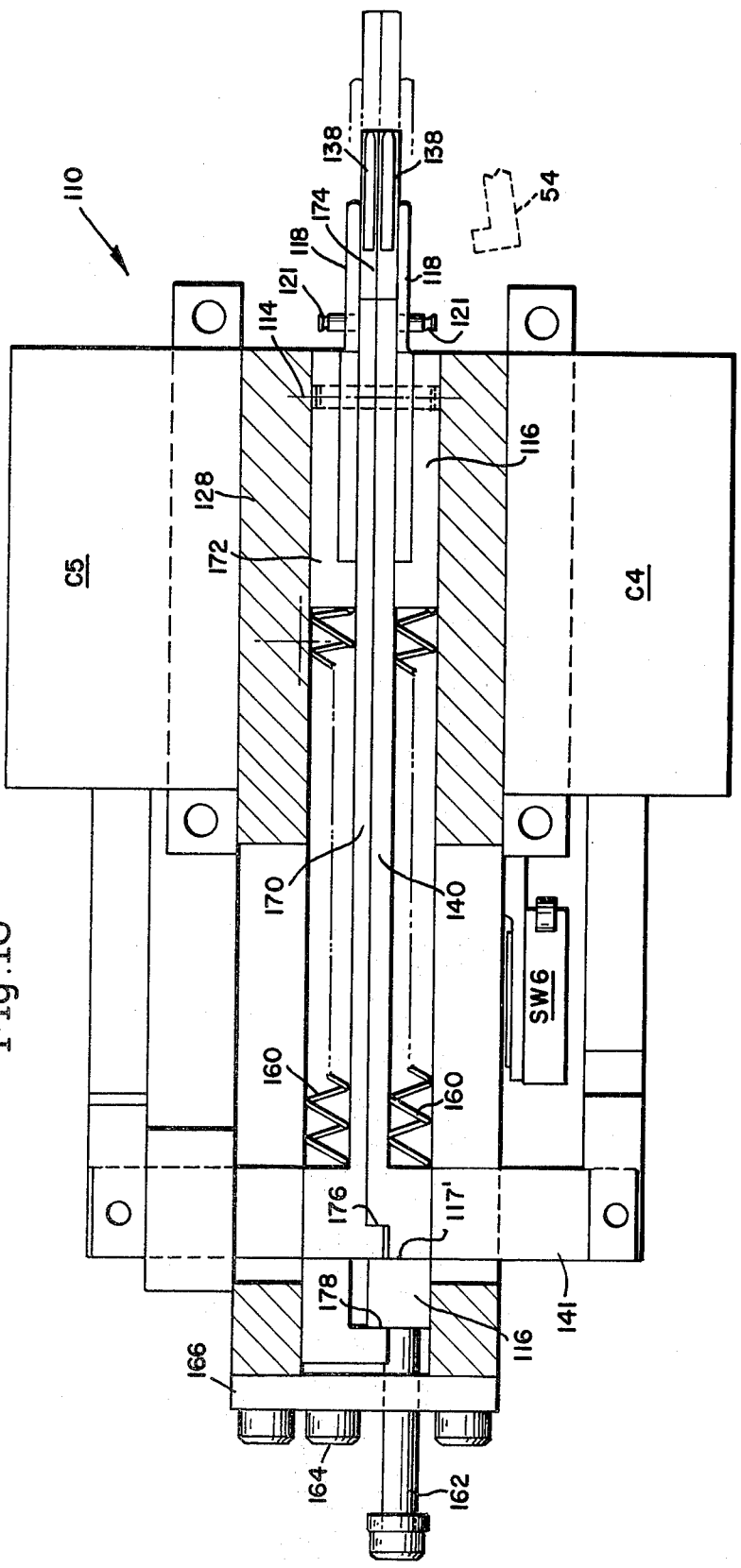

MULTI-MODULE DIP TRANSFER AND INSERTION MACHINE

The apparatus of the instant invention is adapted to replace one-half of a DIP selection and insertion mechanism as disclosed in U.S. Pat. No. 3,727,284 to Ragard, et al, and having a rotary insert head as disclosed in U.S. Pat. No. 4,030,180 to Pierson, with the insert head of the instant invention mounted on the same rotary shaft as that which supports the head of U.S. Pat. No. 4,030,180. Thus, the title "MULTI-MODULE DIP TRANSFER AND INSERTION MACHINE."

Of course, the instant invention could be a separate two and four lead DIP insertion machine in and of itself.

The following description relates only to the two and four lead shuttle and insert head.

Two and four lead DIPs are of the same general shape as the common fourteen and sixteen lead DIPs, but are shorter in body length.

The instant invention addresses the shuttle and insert head assemblies that are used in conjunction with copending application "DIP Component Supply Magazine." In particular, the shuttle assembly of the instant invention includes a pivotal shuttle tooling assembly with extensible component clamping means for cooperation with the supply magazine of the copending application.

The shuttle assembly clamp mechanism removes a component from the supply magazine, retracts, and travels laterally on Thompson shafts to an unload station at which the shuttle assembly is unloaded while simultaneously loading the insert head. Various switches of the machine are used to relay positions of the different mechanisms through an encoder to a programmed controller, thus allowing for programming of the various functions. At the unload station, the shuttle tooling clamp (with a clamped DIP) is extended to load the insert head. The insert head is adapted to receive two or four lead components while in the horizontal position. Upon reception of the components, the insert head is rotated to the vertical position, at which time the leads of the components are inserted into holes of a printed circuit board which is properly located by means of a conventional X-Y positioning system. Having loaded the insert head, the shuttle tooling assembly is dropped to the 'Down' position and the clamping mechanism of the shuttle is retracted for travel to the next programmed magazine supply station.

This process is repeated until all the components have been inserted into the circuit board, whereupon another board is properly positioned by the X-Y system.

Accordingly, it is an object of this invention to provide an automatic apparatus for selecting and inserting two and four lead DIP components into circuit boards.

It is a further object of this invention to provide a novel transfer apparatus which retrieves the components, spreads the leads of the components, and delivers the components to an unload station.

It is a further object of this invention to provide a novel insert head tooling which biases the leads of the components to the proper separation and inserts the components into a printed circuit board.

It is a further object of this invention to provide a novel shuttle assembly for random access selection of components in a DIP component insertion apparatus.

It is a further object of this invention to provide an automatic DIP component insertion apparatus controlled by a computer.

These and other objects of the invention will become readily apparent when reference is taken to the following specification and accompanying drawings in which:

BRIEF DESCRIPTION OF THE DRAWINGS

FIG. 7 is a fragmentary top elevation of the lead spreader and the clamp arm holding a DIP.

FIG. 8 is a front elevation of the shuttle assembly of FIG. 4.

FIG. 9 is a fragmentary view of the shuttle assembly taken along lines 9—9 of FIG. 4, showing switch SW4.

FIGS. 10A–10F are fragmentary side elevations depicting the shuttle loading and unloading sequence.

FIG. 15 is a partial right-side elevation of the insert head of FIG. 14, partially in section.

FIG. 16 is a partial sectional view of the insert head of FIG. 13.

FIGS. 17A–17C are elevational views of two and four lead DIPs.

DETAILED DESCRIPTION OF THE INVENTION

SHUTTLE ASSEMBLY

Figure 1:
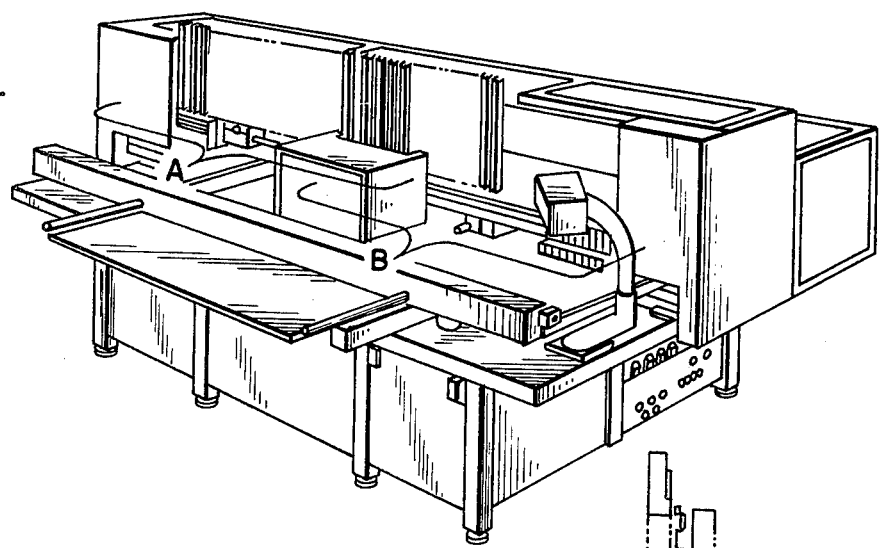
FIG. 1 is a right-side perspective of the overall machine.

Referring to FIG. 1. the right-hand half of the MULTI-MODULE DIP TRANSFER and INSERTION MACHINE, indicated as B, incorporates the apparatus of the instant invention which is directed to 2 and 4 lead DIPs. The left-hand half, indicated as A, incorporates a prior art apparatus directed to more commonly available DIPs.

Figure 2:
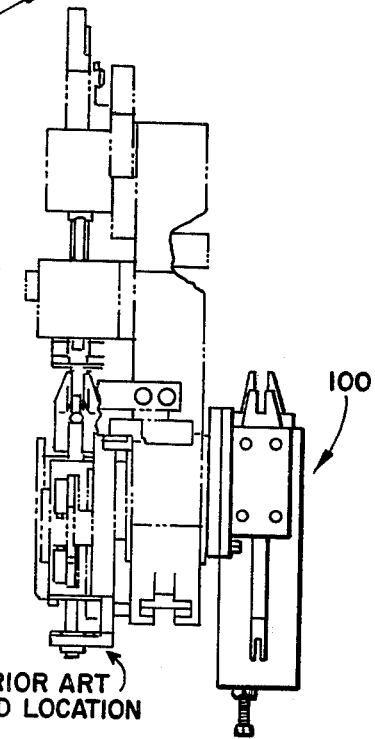
FIG. 2 is a top plan view of the insert heads (old and new) in position for reception of a component.

FIG. 2 illustrates the relative locations of the new insert head 100 and the prior art insert head (indicated in phantom lines), when viewed from the top of the head assembly.

Figure 3:
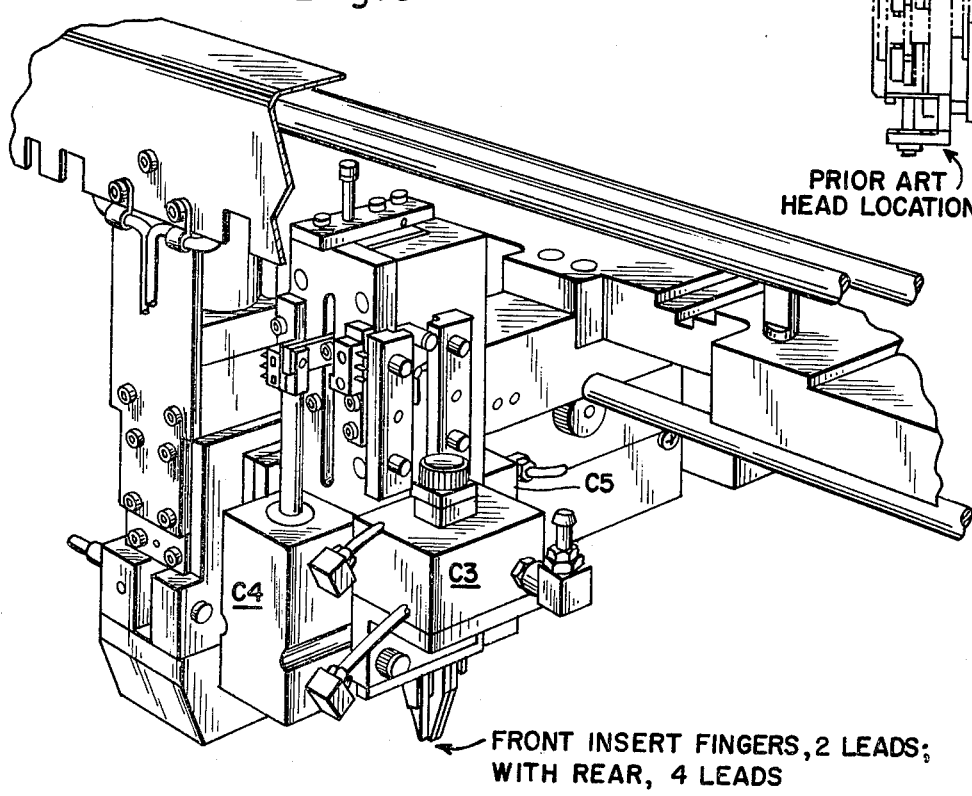
FIG. 3 is a right-side perspective of the insert head assembly.

FIG. 3 is a perspective illustrating the relative positions of pistons/cylinders C3, C4, and C5 of new insert head 100, when it is in the vertical position.

Figure 4:
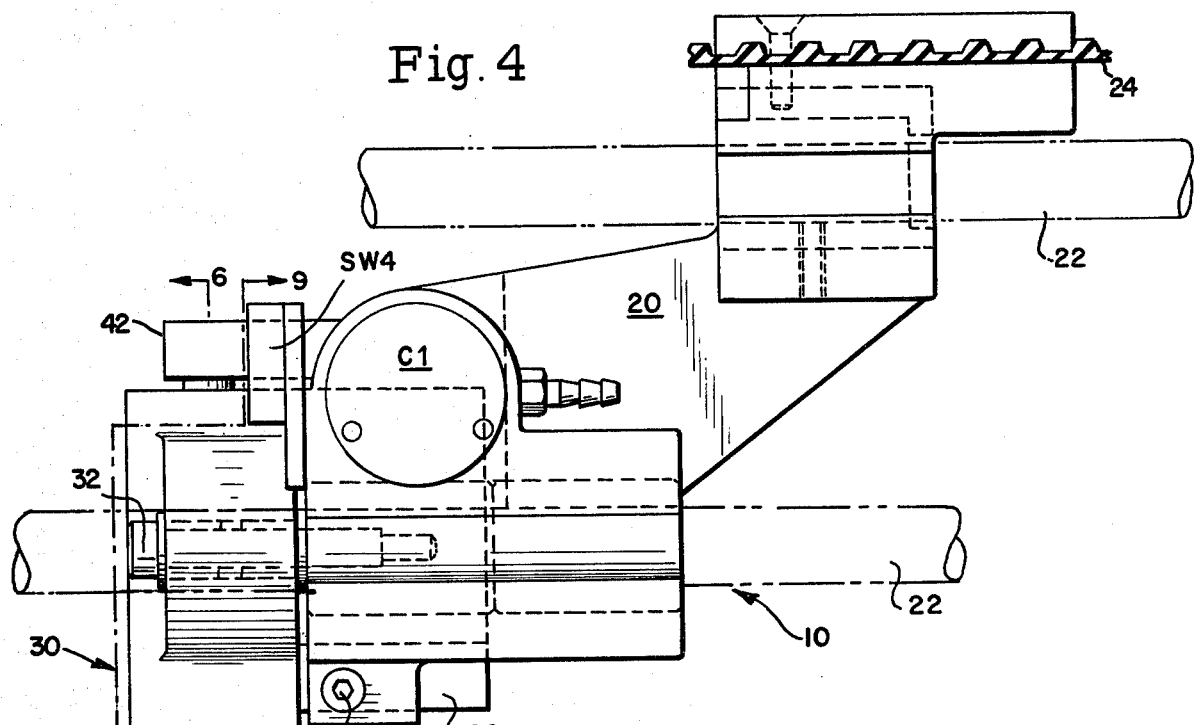
FIG. 4 is a top plan view of the shuttle assembly with the component clamping mechanism fully extended.
Figure 5:
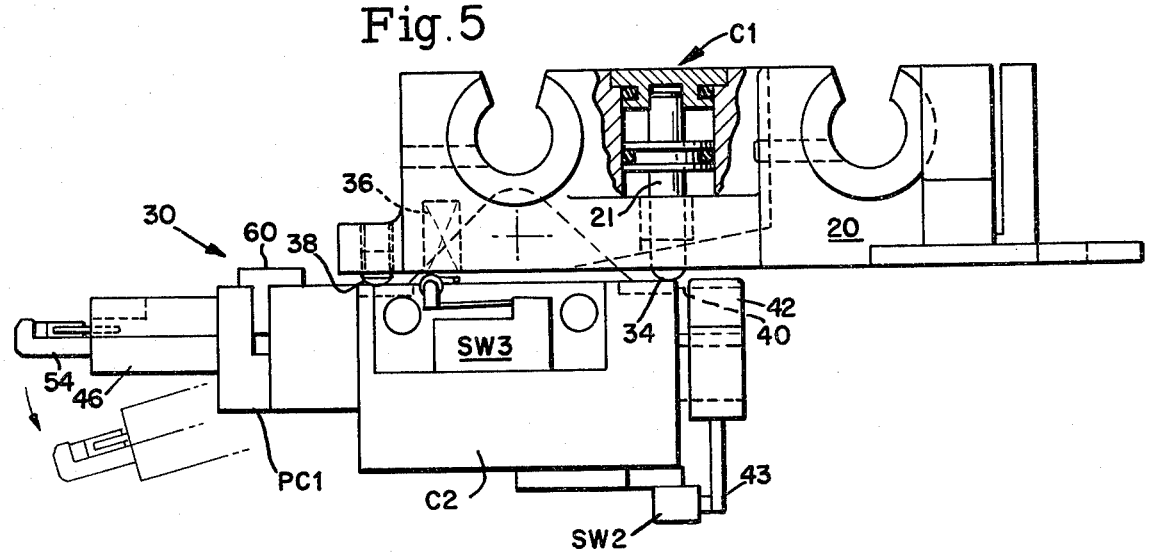
FIG. 5 is a right-side elevation of the shuttle assembly of FIG. 4, partially in section.

Referring to FIGS. 4 and 5, the shuttle assembly 10 comprises a carriage 20 and shuttle tooling assembly 30 pivotally supported on the carriage 20. The carriage 20 is adapted for lateral, sliding movement on conventional Thompson shafts 22 by means of timing belt 24 attached to a conventional delivery system. The shuttle tooling 30 with attached piston/cylinder C2 is pivotally attached to carriage 20 by means of a screw and thrust washer arrangement 32 with the piston 21 of piston/cylinder C1 abutting the top rear housing of piston/cylinder C2 at 34, and compression spring 36 and adjustable stop 38 abutting the top front housing of piston/cylinder C2.

Figure 6:
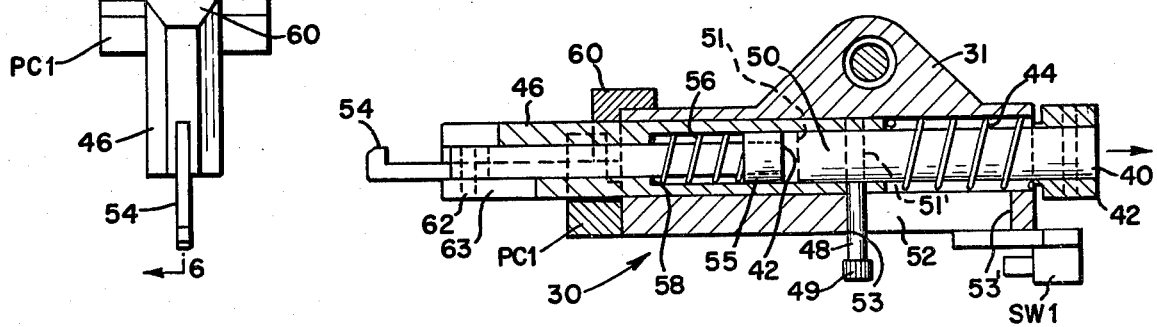
FIG. 6 is a partial right-side elevation of the shuttle tooling assembly along lines 6—6 of FIG. 4.

Push rod 40 of FIG. 6 is connected for simultaneous movement with the piston of piston/cylinder C2 by means of adapter plate 42. As best seen in FIG. 6, spring 44, coaxially surrounding rod 40, abuts adapter plate 42 on the right-hand end and slide tube 46 on the left-hand end. Pin 48 is press fitted into slide tube 46 and is adapted to slide relative to slot 50 (having left end 51 and right end 51') in push rod 40. Pin 48 is further extended downwardly to ride in slot 52 (having left end 53 and right end 53') of housing 31, and has a nub 49 for actuation of switch SW1. The left-hand end of rod 40 abuts enlarged portion 55 of clamp arm 54 which telescopes into slide tube 46. Spring 56 is coaxial with slide tube 46 and clamp arm 54, bearing against internal shoulder 58 of slide tube 46 on one end and enlarged portion 55 of clamp arm 54 on the other end. Slide tube 46 slides within pivotal tooling assembly housing 31. Attached to the left-hand end of housing 31 (as seen in FIGS. 5 and 8) is a U-shaped photocell PC1, through which slide tube 46 and clamp arm 54 may slide. Also attached to the left-hand end of housing 31 is wedge-shaped lead spreader 60 (the wedge-shape best seen in FIGS. 4 and 7). Clamp arm 54 also has a press-fit anti-rotation pin 62 in sliding engagement with slot 63 of slide tube 46. Switch SW3 (FIGS. 5 and 8) is attached to the housing of piston/cylinder C2 for actuation by engagement with carriage 20 when the shuttle tooling assembly 30 is in the horizontal or "Up" position of FIG. 5.

When rod 40 is retracted (to the right in FIGS. 5 and 6), slide tube 46 is also retracted by abutment of pin 48 with the left-hand end 51 of slot 50 in rod 40 and switch SW1 is made by nub 49. Spring 56 biases clamp arm 54 to the right against rod 40 during this retraction. Retraction of the piston of piston/cylinder C2 (for extension of push rod 40) causes extension of clamp arm 54 to the left, with spring 44 biasing slide tube 46 to the left until pin 48 abuts the left-hand end 53 of housing slot 52. With slide tube motion stopped at this point, further extension of rod 40 extends clamp arm 54 further, relative to slide tube 46, against the action of spring 56 to the fully extended position of FIGS. 5 and 6. Retraction of rod 40 to the right without a DIP 80 (FIGS. 17A–17C) clamped between clamp arm 54 and slide tube 46 allows the left-hand end of slide tube 46 to be generally flush with the left-hand end of housing 31, allowing clamp arm 54 to be slightly extended out of slide tube 46, such that a gap remains in the clamping mechanism to prevent the interruption of photocell PC1 and thus indicating that a DIP is not in the clamp. Retraction, with a DIP 80 between clamp arm 54 and slide tube 46, allows a clamping action due to spring 56, with subsequent spreading of DIP leads 82 by lead spreader 60 and interruption of photocell PC1. With the carriage 20 of the shuttle assembly opposite the selected magazine 90 and the shuttle tooling assembly 30 in the 'Down' position of FIG. 10F, switch SW4 (seen in FIGS. 4 and 9) is made and the program causes actuation of piston/cylinder C2, so that clamp arm 54 and slide tube 46 are extended and switch SW2 is made by an adapter plate extension 43 to actuate pivot piston/cylinder C1, extending the piston rod 21 against the upper rear portion 34 of the shuttle tooling assembly housing 31. This causes the shuttle tooling assembly 30 to pivot to the 'Up' position of FIG. 10A making switch SW3, which causes actuation of piston/cylinder C2 for retraction of clamp arm 54 and slide tube 46 to the position of FIG. 10B with a part (2, 4 lead DIP) clamped therein, while spreading the leads 82 and making switch SW1. If the component 80 is in position in the clamp, photocell PC1 is made and the shuttle assembly 10 is moved laterally on Thompson shafts 22 to an unload station while the clamp of shuttle tooling assembly 30 is in the retracted position.

If the component 80 is not clamped in position such that photocell PC1 is interrupted, then the "Part Missing" condition occurs; this condition will be discussed later.

Figure 10C:
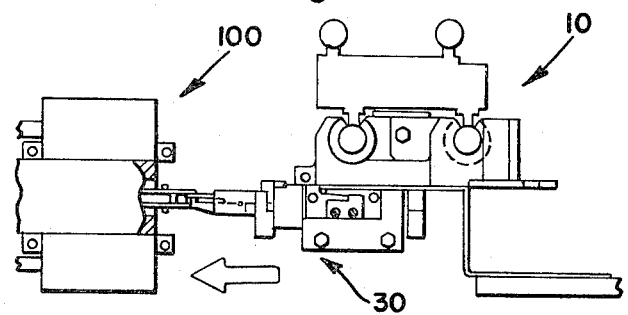
Figure 10D:
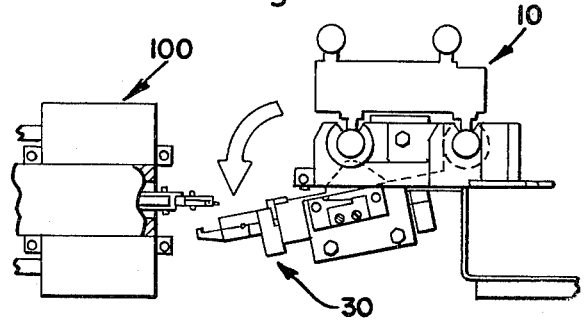
Figure 10E:
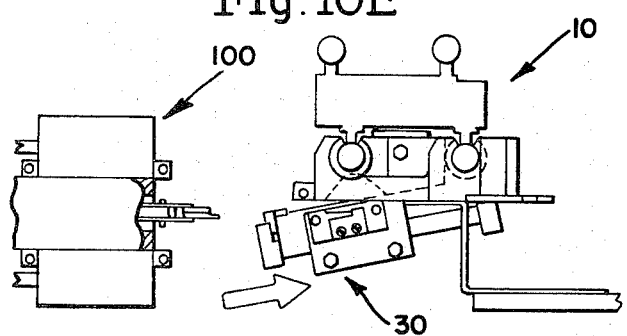
Figure 10F:
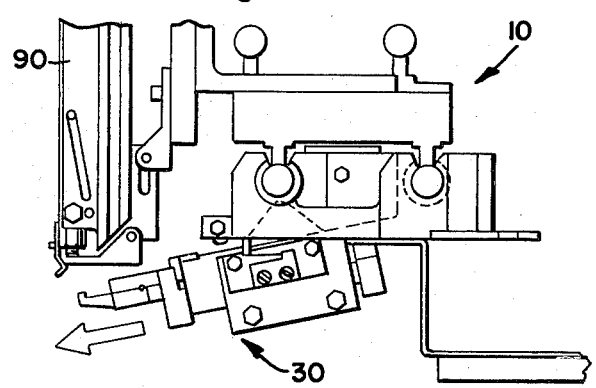
Figure 12:
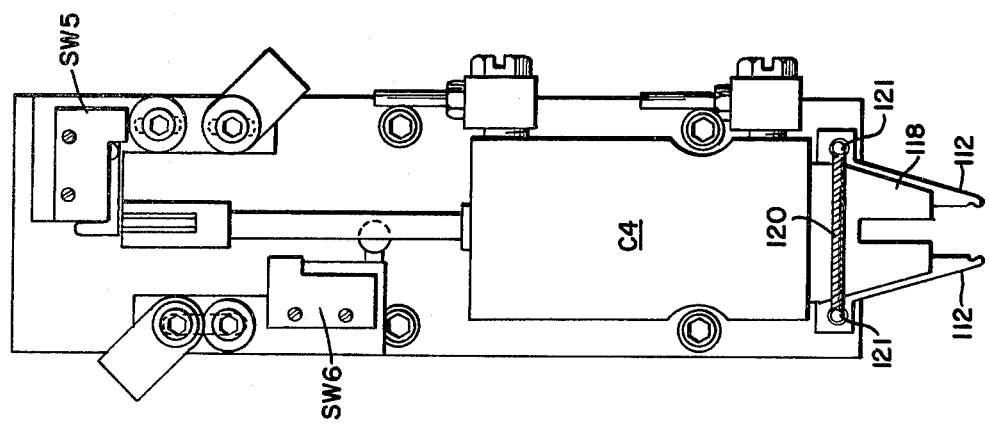
FIG. 12 is a partial left-side elevation of the insert head of FIG. 13.

According to the distance between magazine 90 and the unload station that must be traveled by the shuttle assembly 10 on the Thompson shafts 22, the shuttle assemby 10 will sometimes arrive at the unload station before the insertion head 100 completes the previous insert cycle and is ready to be rotated to the horizontal position. When this condition occurs, shuttle 10 waits for head 100 to rotate to the horizontal position according to programmed instructions. When insert head 100 is already in the horizontal position (and switch SW5 of FIG. 12 is made to indicate the head tooling assembly 110, as best seen in FIGS. 15 and 16, is in the retracted position for acceptance of a component 80), the shuttle tooling 30 will immediately load the head 100 by actuation piston/cylinder C2 to extend the clamp 54 and slide tube 46 (as seen in FIG. 10C), thereby making switch SW2. When switch SW2 is made, pivot piston/cylinder C1 is deenergized and the compression spring 36 returns the shuttle tooling assembly 30 to the 'Down' position (as seen in FIG. 10D), thus making switch SW4 to indicate that the shuttle tooling 30 is 'Down' and that the shuttle 10 can again retract and move laterally on the Thompson shafts 22 without interfering with the horizontally positioned insertion head 100. During lateral movement of the shuttle 10 to and from the insert head 100 and magazine 90 the clamp is retracted (as in FIG. 10E).

INSERTION HEAD

Figure 20:
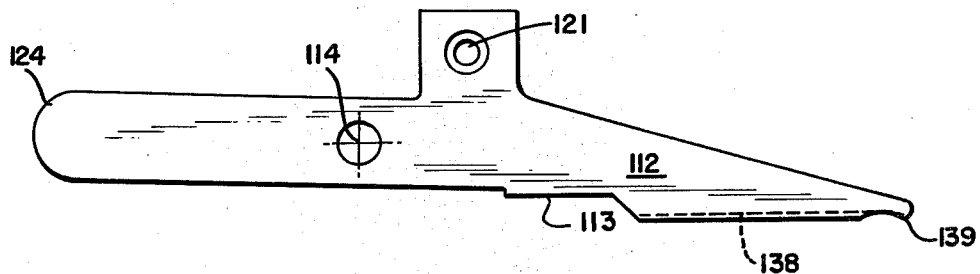
FIG. 20 is a detailed elevational view of a jaw of the insert head assembly.

Referring to FIGS. 15 and 16 for 2 lead DIP insertion, with the insert head assembly 100 in the horizontal position (switch SW7 made) for acceptance of a component 80 from the shuttle tooling assembly 30, the head tooling 110 is in the retracted position with jaws 112 open and switch SW5 (shown in FIG. 5) made. Jaws 112 are pivotally attached at pivot points 114 to slide 116 and retaining plates 118 with a spring 120 attached to jaws 112 at 121 to bias their exposed ends towards each other between retaining plates 118. During retraction of slide 116, the opening of jaws 112 is controlled by engagement of unexposed ends 124 with spacer 126. In particular, with slide 116 fully retracted, ends 124 bear against the inside of spacer 126 at 130 such that the jaws are in the open position. Jaws 112 are now in position reception of a component as indicated by the making of switch SW5 (FIG. 12). Shuttle tooling clamp 54 (in the horizontal position with clamp DIP) is extended (as in FIG. 10C) to simultaneously unload the shuttle 10 and load the insert head tooling 110. Retaining plates 118 are slotted at 136 (FIG. 15) to accommodate extension of clamp arm 54. The leads 82 of the DIP 80, having earlier been spread by spreader 60 of the shuttle tooling 30, ride into grooves 138 (shown in FIG. 20) of jaws 112 with a resilient friction fit and past inwardly extending tips 139. The body of the DIP is slightly above or in engagement with bottom retaining plate 118 of FIG. 16. Clamp 54 is released and shuttle tooling 30 is pivoted downward, as in FIG. 10D (nominally at a 15° angle from horizontal), clearing the head tooling 110.

Figure 11A:
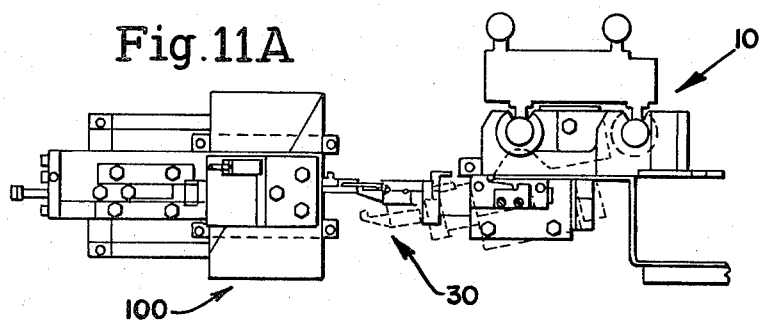
FIGS. 11A–11D are fragmentary elevations depicting the head insert sequence.
Figure 11B:
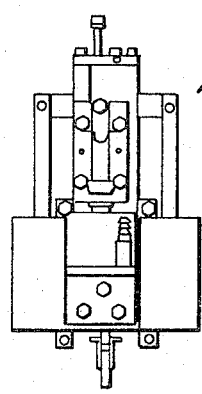
Figure 11C:
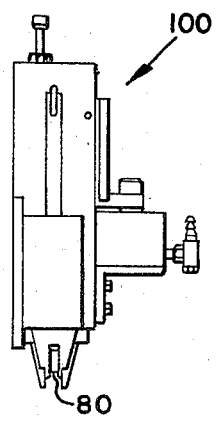
Figure 11D:
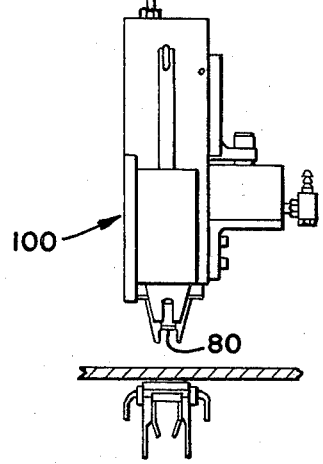

After a programmed time delay to avoid interference with the shuttle tooling 30, the insert head 100 is rotated to the vertical position of FIG. 11B.

Referring to FIGS. 15 and 16, retaining plate 118 prevents inertial throwing of the DIP 80 during this vertical rotation. Piston/cylinder C4 is energized to extend the two-lead driver 140 (by driver arm 141) and associated slide plate 116 down into the insertion position.

Figure 18:
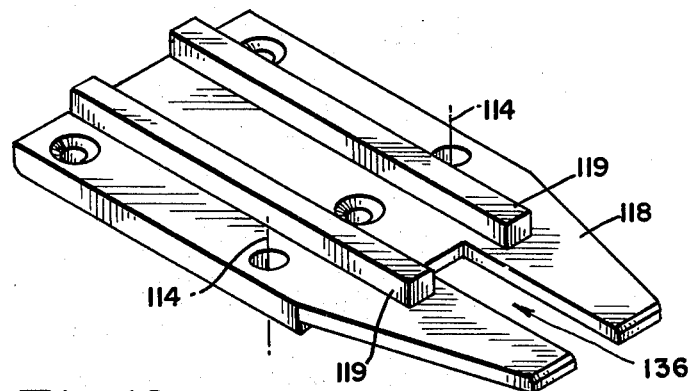
FIG. 18 is a detailed elevational view of a retaining plate of the insert head assembly.
Figure 19:
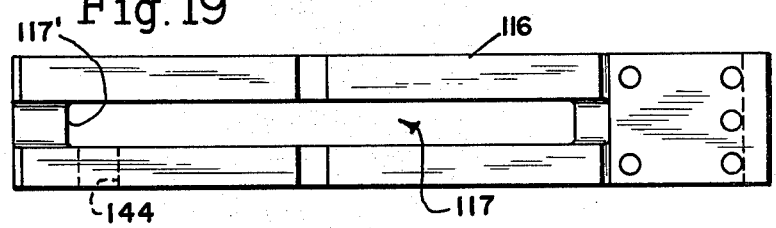
FIG. 19 is a detailed elevational view of the two lead slide plate of the insert head assembly.

During extension of slide plate 116 and attached retaining plate 118, the closing of jaws 112 is restricted by retainer plate shoulders 119, as best seen in FIG. 18. For instance, as the slide 116 and jaws 112 are extended to the phantom line position of FIG. 16, ends 124 ride along cam surfaces 132 of the spacer 126 under the influence of spring 120 until portions 113 (FIG. 20) of the exposed ends of jaws 112 engage retaining plate shoulders 119.

During the first quarter-inch of this extension of the driver 140 and slide 116, the jaws 112 partially close, due to springs 120 as explained previously, forcing the leads 82 closer together and to the tolerance needed for insertion of the leads 82 into the holes of the printed circuit board (nominally a 0.300 inch center distance).

Figure 14:
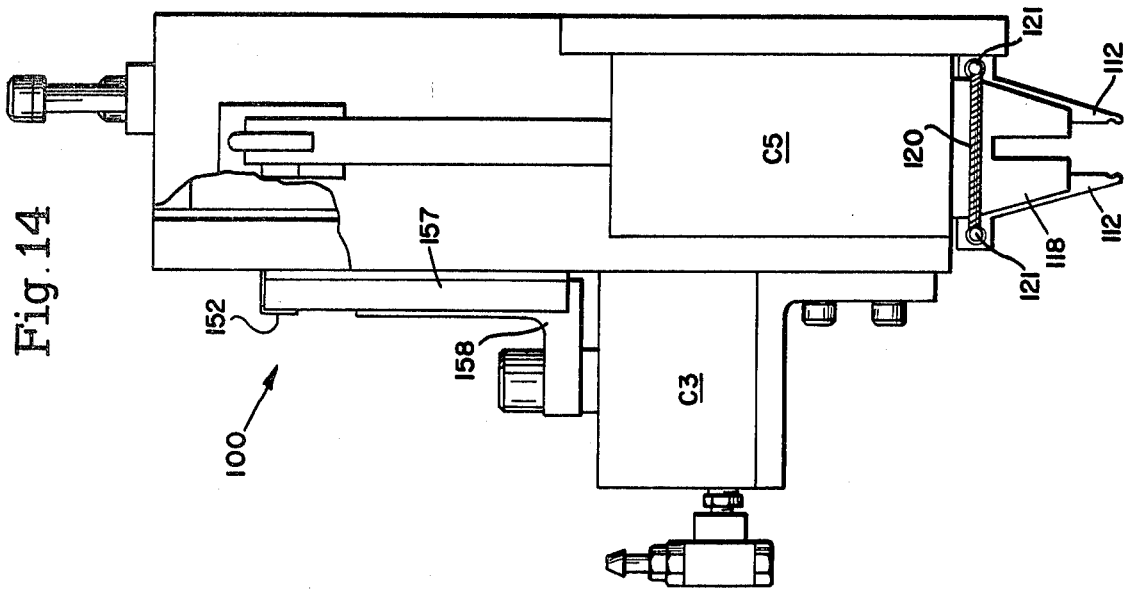
FIG. 14 is a right-side elevation of the insert head of FIG. 13.
Figure 13:
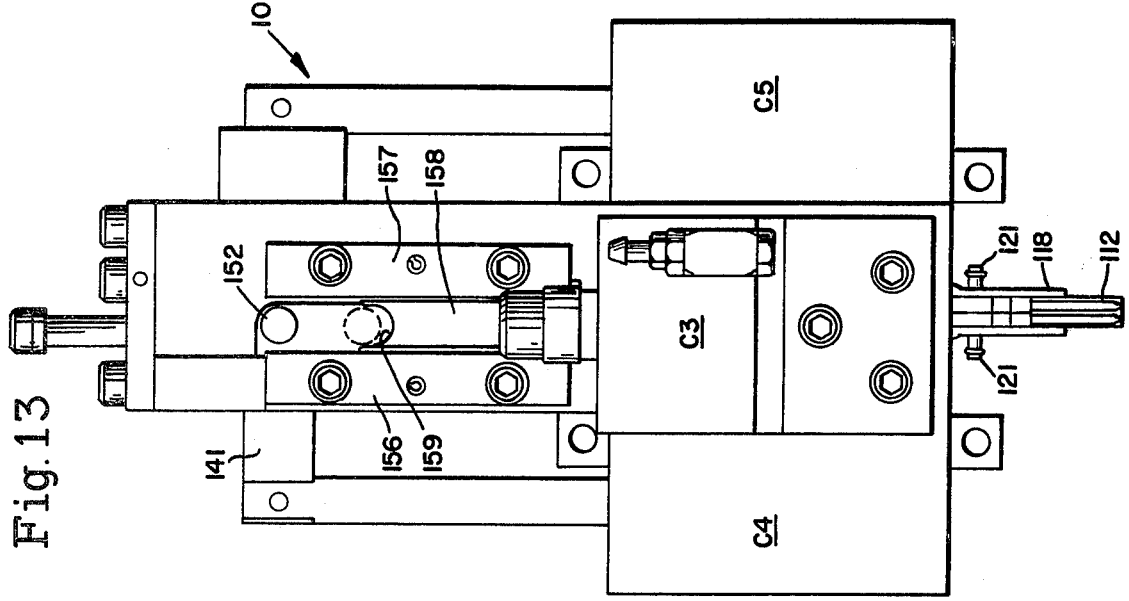
FIG. 13 is a right-side elevation of the insert head assembly.
Figure 21:
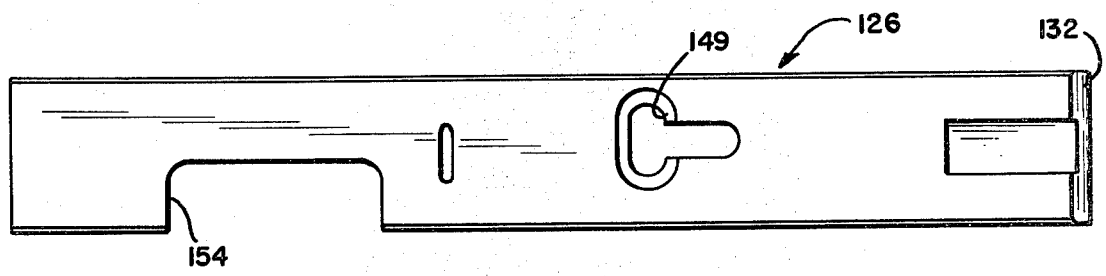
FIG. 21 is a detailed elevational view of a spacer of the insert head assembly.

A detent 142 having beveled inner and outer ends (as seen in FIG. 15) is adapted for sliding movement within a channel 144 of slide plate 116. With the slide plate 116 and driver 140 in the retracted position (and holding a DIP), the inner end 146 of detent 142 extends into a beveled recess 148 of the driver 140 and is retained in this beveled recess 148 by engagement of the outer end 150 with spacer 126 as the driver 140 and slide plate 116 are extended. The outer end 150 slides along this spacer 126 until it registers with and is forced into beveled orifice 149 (best seen in FIGS. 15 and 21). Beveled orifice 149, while preventing detent 142 from passing all the way through it, allows some lateral 'play' for different DIP thicknesses. Therefore, an adjustable stop 162 may be used to set the exact limit of extension of slide plate 116. The slide plate 116 includes an attached stop rod 152 (FIGS. 13 and 15) which extends through groove 154 (FIG. 21) in spacer 126 and between members 156 and 157 that form a guide for an L-shaped member 158 (FIGS. 13, 14) which is attached to a partial retraction piston/cylinder C3. This L-shaped member 158 has a semi-circular portion 159, viewed as the upper end of L-shaped member 158 in FIG. 13, to form an abutment for rod 152. After detente 142 registers with orifice 149 and adjustable stop 162 halts slide plate 116, driver 140 continues to extend, further compressing a spring 160 (FIG. 16) until the DIP is fully inserted and rod 152 is thus moved into engagement with the semi-circular abutment 159 of the L-shaped member 158. This further extending of driver 140 causes driver arm 141 (FIG. 16) to make switch SW6; this indicates a full stroke and actuates a conventional clinch mechanism underneath the printed circuit board for clinching the leads of the DIP. During firing of this clinch mechanism, partial retraction piston/cylinder C3 (FIGS. 13 and 14) is caused to slightly extend (approximately $\frac{1}{8}''$) thereby slightly retracting slide 116 by means of engagement of L-shaped member 158 with rod 152. This slight retraction of slide 116 causes a sliding release of jaws 112 from the leads 82 of DIP 80, while the driver 140 remains in contact with the top of the body of the DIP 80, to thereby prevent the jaws 112 from pulling the clenched DIP 80 from the printed circuit board.

After a software time delay (approximately 66 milliseconds), piston/cylinder C4 is caused to fully retract driver 140 (and slide 116 which is held in contact with driver 140 by spring 160). As best understood by reference to FIGS. 16 and 20, driver arm 141 extends into slot 117 of slide 116 and is biased by spring 160 against the left end 117' of slot 117. Retraction of slide 116 causes the outer end 150 of detente 142 to ride out of orifice 149 and the inner end 146 to reengage in the beveled recess 148 of driver 140. The extent of retraction is controlled by adjustable stop member 164 (FIG. 16) threaded into plate 166 on housing 128 to stop retraction of the slide. Unexposed jaw ends 124 also ride back up cam surface 132 of spacer 126 to fully open the jaws. With the driver 140 in the retracted position, switch SW5 (FIG. 12) is made to actuate rotation of the head 100 to the horizontal position of FIG. 10C for loading of another DIP.

When, under the direction of the program, a four lead DIP has been delivered to the unload station for loading into the insert head 100, both piston/cylinder C5 and piston/cylinder C4 are energized. Associated with this piston/cylinder C5 are four-lead driver 170 and slide 172 (with jaws 174), both of which respectively are overlapped with the two-lead driver 140 and slide 116, as at 176 and 178 (in FIG. 16). Due to this overlapping arrangement, the insertion cycle is the same as that described for the two-lead DIPs, except that both piston/cylinders C5 and C4 provide the insertion and retraction power.

This split tooling for two and four head DIPs allows for a much smaller tooling "footprint" (e.g., the area of the P.C. board covered by the jaws and component body during insertion) when only a two lead DIP is to be inserted.

PART MISSING

If, during retraction of the component clamping mechanism at the programmed magazine, there is no component in the clamp, then photocell PC1 will not be interrupted. For instance, this will occur if the programmed supply magazine is empty. In this instance, an indicator/push button switch on a control panel will light to notify the operator of the machine. Pushing of this indicator/push button will cause the shuttle to attempt retrieval of a component from the same magazine. If the indicator continues to glow, another push of the switch will cause the shuttle to go to a programmed alternate magazine. If an alternate magazine is not programmed, then the machine will halt for reloading of the appropriate magazine. The operator must then move the shuttle to a park position (clear of all magazines) by pushing a "LOAD MAG" button on the control panel.

To prevent damage to the machine and processing of boards with faulty insertions, the machine is designed to automatically interrupt operation when abnormal conditions occur. Sensor switches are used to monitor each phase of machine operation and to detect when machine limits are exceeded. Machine operation is interrupted whenever any one of these sensor switches fails to close or open at the required time, thus indicating that a necessary phase of operation has not been completed.

While only the preferred embodiment of the shuttle and insert head assemblies have been shown and described, it will be obvious to those of ordinary skill in the art that many changes may be made to the apparatus without departing from the scope of the appended claims.

We claim:

1. An apparatus for inserting electronic components, said components having a body and dual in-line parallel leads extending therefrom, said apparatus comprising:
    a magazine for supplying said components one at a time at a first station;
    an insert head means for receiving an individual component at a second station, rotating to an insert position, and inserting said component into a printed circuit board; and
    a shuttle means for engaging said magazine, and releasing and removing an individual component from said magazine assembly at said first station, transporting said component to said second station, loading said insert head means with said component, and returning to said magazine assembly.

2. An apparatus as in claim 1, wherein said shuttle means comprises:
    a carriage supported on and driveable along a support means between said first and second stations;
    a shuttle tooling assembly housing supported by said carriage and pivotal between a first position and a second position;
    a clamp means mounted on and moveable relative to said housing between an extended position and a retracted position for clamping said individual component, and a lead spreader mounted on said pivotal housing for biasing opposed leads of said component, during movement of said clamp means to said retracted position, to a spacing beyond the spacing desired for insertion.

3. An apparatus as in claim 2, wherein said clamp means comprises:
    a reciprocable slide tube and a telescoping clamp arm slideable relative to said slide tube to cooperatively clamp said component while in said extended position and to move said clamped component to said retracted position, forcing the leads of said component into engagement with said lead spreader during said movement.

4. An apparatus as in claim 3, wherein said clamp means further comprises:
    an actuator means in engagement with said clamp arm and slidable with respect to said slide tube for extension of said clamp arm;
    a pin fixedly engaged to said slide tube and slidably engaged with and extending though a slot in said actuator means for retraction of said slide tube;
    a first biasing means for biasing said clamp arm into engagement with said actuator means and to a retracted position relative to said slide tube, and
    a second biasing means for biasing said slide tube to an extended position relative to said actuator means,
    whereby pushing said actuator means causes said second biasing means to extend said slide tube and further extend said clamp arm relative to said slide tube and pulling said actuator means causes retraction of said slide tube by means of sliding engagement between said pin and slot and retraction of said clamp arm relative to said slide tube by means of said first biasing means.

5. An apparatus as in claim 4, wherein said housing further comprises:
    a slot through which said pin further extends and slidably engages, said slot adapted to stop said slide tube in said extended position by engagement with said pin.

6. An apparatus as in claim 5, wherein said housing further comprises:
    a first switch and said pin includes a nub means for actuation of said first switch when said slide tube is in the retracted position; and
    a second switch engageable with said carriage when said housing is in said first position.

7. An apparatus as in claim 3, wherein:
    said pivotal housing includes a front end and a top rear portion, and
    said carriage includes a first position stop, a pivot means for pivoting said front end to said first position and into abutting relation with said first position stop, second position stop means for abutting said top rear portion to provide a limit of travel for said front end in said second position, and a returns means for pivoting said front end to said second position.

8. An apparatus as in claim 7, wherein:
    said front end in said first position is disposed substantially horizontally and in said second position is disposed approximately fifteen degrees below horizontal.

9. An apparatus as in claim 7, wherein:
    said pivot means includes a piston rod bearing against said top rear portion, and
    said return means includes a compression spring bearing against said front end.

10. An apparatus as in claim 3, wherein said housing further comprises:
    a detection means for detecting the presence or absence of said clamped component.

11. An apparatus as in claim 1, wherein said insert head means comprises:
    a housing;
    jaw means, pivotal between an open position and a closed position, for reception of said component;
    slide plate means, reciprocable in said housing between a retracted position and an extended position, for pivotal attachment of said jaw means;
    driver means, reciprocable in said housing relative to said slide plate means between a retracted position and an extended position and engageable with said component, for insertion of said component;
    biasing means for biasing said driver means relative to said slide plate means, whereby extension of said driver means tends to cause extension of said slide plate means, and retraction of said slide plate means tends to cause retraction of said driver means, and actuator means for extension and retraction of said driver means.

12. An apparatus as in claim 11, wherein said insert head means further comprises:
spacer means for limiting closing of said jaw means when said slide plate means is in said retracted position.

13. An apparatus as in claim 11, wherein said insert head means further comprises:
retainer plate means for preventing inertial throwing of said component out of said jaw means during rotation of said insert head to said insert position.

14. An apparatus as in claim 13, wherein said retainer plate means further comprises:
shoulder means for limiting closing of said jaw means when said slide plate is in said extended position.

15. An apparatus as in claim 11, wherein said insert head means further comprises:
a first adjustable stop means for limiting movement of said slide plate means to said extended position, and
a second adjustable stop means for limiting movement of said slide plate means to said retracted position.

16. An apparatus as in claim 11, wherein said insert head means further comprises:
limit switches actuated by said driver means in said extended and retracted positions.

17. An apparatus as in claim 11, wherein said insert head means further comprises:
a partial retractor means for engaging and partially retracting said slide plate means, upon command.

18. An apparatus as in claim 11, wherein said insert head means further comprises:
a detent having inner and outer ends and reciprocable within a channel in said slide plate means,
said inner end engageable with a recess in said driver means and said outer end engageable in an orifice in a spacer means,
whereby said inner end is engaged in said driver recess when said driver means and said slide means are in their retracted positions, and said outer end is engaged in said spacer orifice during extension of said driver means and said slide plate means to the extended position of said slide plate means where said inner end disengages with said driver recess, thus allowing further extension of said driver means to a fully extended position in engagement with said component.

19. An apparatus as in claim 12, wherein said spacer means comprises:
cam surfaces for engaging said jaw means during retraction of said slide plate means and camming said jaw means to said open position.

20. An apparatus as in claim 11, wherein said jaw means comprises:
closing means for biasing said jaw means toward said closed position, and
grooved faces for frictionally engaging the leads of said component to hold said component.

21. An apparatus as in claim 11, wherein said jaw means close the spacing of opposed leads of said component to a proper distance for insertion into a printed circuit board when pivoted to said closed position.

22. An apparatus as in claim 11, wherein:
said jaw means, slide plate means, driver means, biasing means, and actuator means each respectively are divided into first side members and second side members, the members of said first side operable seperately of said second side members for reception and insertion of a first size component and the members of said second side operable with said first side members for reception and insertion of a second size component upon command.

23. An apparatus as in claim 1, including sensor means for sensing predetermined positions of said shuttle means and said insert head means and producing signals.

24. An apparatus as in claim 1 wherein said apparatus includes a pantograph means, located directly under said insert head, for supporting a printed circuit board having pre-drilled holes to receive the leads of said components.

25. An apparatus as in claim 1, wherein said apparatus further comprises:
another insert head means, rotatable with said insert head means, for individually receiving and inserting components of a size different from those received and inserted by said insert head means,
whereby said insert head means or said other insert head means receives and inserts a component according to a command.

26. An apparatus as in claim 1, including a computer means for receiving signals when said shuttle means and said insert head means are in predetermined positions and for giving commands for operation of said apparatus to automatically sequence the operations of said shuttle assembly and said insert head.

27. An apparatus as in claim 1 wherein said apparatus further comprises a pantograph assembly for supporting and moving a printed circuit board to locate said circuit board underneath said insert head means at a predetermined position to receive a component.

* * * * *

UNITED STATES PATENT AND TRADEMARK OFFICE
CERTIFICATE OF CORRECTION

PATENT NO. : 4,283,836
DATED : August 18, 1981
INVENTOR(S) : Stanley Janisiewicz & Robert H. Holmes It is certified that error appears in the above-identified patent and that said Letters Patent are hereby corrected as shown below:

ON THE TITLE PAGE:
Please correct the title of the invention to

"TWO AND FOUR LEAD DIP TRANSFER AND INSERTION MACHINE".

Column 1, line 12 change "MULTI-MODULE" to

--TWO AND FOUR LEAD--.

Column 2, lines 58-59 delete "MULTI-MODULE" and insert --TWO AND FOUR LEAD--.

Signed and Sealed this

*Twenty-fourth* Day of *November 1981*

[SEAL]

*Attest:*

GERALD J. MOSSINGHOFF

*Attesting Officer*     *Commissioner of Patents and Trademarks*